United States Patent
Poon et al.

(10) Patent No.: US 8,674,327 B1
(45) Date of Patent: Mar. 18, 2014

(54) SYSTEMS AND METHODS FOR UNIFORMLY IMPLANTING MATERIALS ON SUBSTRATES USING DIRECTED MAGNETIC FIELDS

(75) Inventors: Chin Yim Poon, Santa Clara, CA (US);
Yew Ming Chiong, San Jose, CA (US);
Paul C. Dorsey, Los Altos, CA (US);
Tatsuru Tanaka, Campbell, CA (US)

(73) Assignee: WD Media, LLC, San Jose, CA (US)

( * ) Notice: Subject to any disclaimer, the term of this patent is extended or adjusted under 35 U.S.C. 154(b) by 118 days.

(21) Appl. No.: 13/468,919

(22) Filed: May 10, 2012

(51) Int. Cl.
*H01L 21/265* (2006.01)
*H01L 21/00* (2006.01)
*H05H 1/02* (2006.01)

(52) U.S. Cl.
USPC ........... 250/492.21; 250/492.2; 250/493.1; 250/298; 315/111.41; 315/111.21; 427/523; 438/473; 118/723 E

(58) Field of Classification Search
USPC .............. 250/492.21, 492.2, 493.1, 298; 315/111.41, 111.21; 427/513; 438/473; 118/723 E
See application file for complete search history.

(56) References Cited

U.S. PATENT DOCUMENTS

| | | |
|---|---|---|
| 4,597,847 A | 7/1986 | Boys |
| 4,604,180 A | 8/1986 | Hirukawa et al. |
| 4,647,361 A | 3/1987 | Bauer |
| 4,714,536 A | 12/1987 | Freeman et al. |
| 4,995,958 A | 2/1991 | Anderson et al. |
| 5,126,029 A | 6/1992 | Tomer et al. |
| 5,174,880 A | 12/1992 | Bourez et al. |
| 5,200,049 A | 4/1993 | Stevenson et al. |
| 5,215,638 A | 6/1993 | Hausler |
| 5,252,194 A | 10/1993 | Demaray et al. |
| 5,477,743 A | 12/1995 | Yanagisawa |
| 5,512,150 A | 4/1996 | Bourez et al. |
| 5,554,249 A | 9/1996 | Hasegawa et al. |
| 5,645,699 A | 7/1997 | Sieck |
| 5,685,959 A | 11/1997 | Bourez et al. |
| 5,736,020 A | 4/1998 | Lal et al. |
| 5,762,766 A | 6/1998 | Kurita et al. |
| 5,795,451 A | 8/1998 | Tan et al. |
| 5,879,523 A | 3/1999 | Wang et al. |
| 5,968,328 A | 10/1999 | Teschner et al. |
| 6,024,843 A | 2/2000 | Anderson et al. |
| 6,033,483 A | 3/2000 | Demaray et al. |
| 6,139,695 A | 10/2000 | Washburn et al. |
| 6,228,236 B1 | 5/2001 | Rosenstein et al. |
| 6,258,217 B1 | 7/2001 | Richards et al. |

(Continued)

FOREIGN PATENT DOCUMENTS

| | | |
|---|---|---|
| JP | 09-219020 | 8/1997 |
| JP | 2000-063912 | 2/2000 |

*Primary Examiner* — Nikita Wells

(57) ABSTRACT

Systems and methods for uniformly implanting materials on substrates using directed magnetic fields are provided. One such system includes a chamber configured to receive a preselected material and to enclose a first substrate, first and second rotating assemblies configured to facilitate an implantation of the preselected material onto first and second surfaces of the first substrate and including first and second rotating magnet sub-assemblies configured to direct magnetic fields onto the first and second surfaces, and an RF energizer configured to apply RF energy to the first substrate, where the first magnetic field and the second magnetic field combine to form a resultant magnetic field that is substantially parallel along the first surface, and where the implantation of the preselected material onto the first substrate occurs based on a combination of the RF energy and the resultant magnetic field.

34 Claims, 7 Drawing Sheets

(56) References Cited

U.S. PATENT DOCUMENTS

| | | |
|---|---|---|
| 6,277,250 B1 | 8/2001 | Russell et al. |
| 6,312,798 B1 | 11/2001 | Ma et al. |
| 6,322,679 B1 | 11/2001 | De Bosscher et al. |
| 6,330,052 B1 * | 12/2001 | Yonekawa et al. ............... 355/53 |
| 6,365,010 B1 | 4/2002 | Hollars |
| 6,383,574 B1 * | 5/2002 | Han et al. ...................... 427/526 |
| 6,406,599 B1 | 6/2002 | Subramani et al. |
| 6,413,382 B1 | 7/2002 | Wang et al. |
| 6,413,383 B1 | 7/2002 | Chiang et al. |
| 6,610,184 B2 | 8/2003 | Ding et al. |
| 6,706,363 B2 | 3/2004 | Honda et al. |
| 6,841,050 B2 | 1/2005 | Hong et al. |
| 6,852,202 B2 | 2/2005 | Miller et al. |
| 6,946,046 B2 * | 9/2005 | Yanagita et al. ............... 156/239 |
| 7,018,515 B2 | 3/2006 | Gung et al. |
| 7,119,489 B2 | 10/2006 | Shin et al. |
| 7,169,271 B2 | 1/2007 | Hong et al. |
| 7,182,843 B2 | 2/2007 | Stelter et al. |
| 7,208,878 B2 | 4/2007 | Shin et al. |
| 7,504,006 B2 | 3/2009 | Gopalraja et al. |
| 8,137,517 B1 | 3/2012 | Bourez |
| 2003/0209423 A1 | 11/2003 | Christie |
| 2005/0103620 A1 | 5/2005 | Chistyakov |
| 2005/0236267 A1 | 10/2005 | Rich |
| 2006/0081466 A1 | 4/2006 | Nagashima et al. |
| 2007/0227881 A1 | 10/2007 | Gaertner et al. |
| 2008/0060938 A1 | 3/2008 | Miller et al. |

\* cited by examiner

SYSTEMS AND METHODS FOR UNIFORMLY IMPLANTING MATERIALS ON SUBSTRATES USING DIRECTED MAGNETIC FIELDS

FIELD

The present invention relates generally to implanting materials on substrates, and more specifically to systems and methods for uniformly implanting materials on substrates using directed magnetic fields.

BACKGROUND

In the manufacture of substrates for various applications such as magnetic disks for disk drives, it is often important to implant particular materials on the substrates. Currently, nitrogen implantation is performed on two disks simultaneously using a sputter tool designed to give high throughput. To facilitate the implantation, RF power is applied to a carrier holding two disks/substrates under the influence of a magnetic field. The presence of the magnetic field increases the plasma density and the rate of nitrogen implantation. The magnetic field is produced by four ring magnet packs which are held stationary in front of each of the disk surfaces of the two disks. However, due to the magnetic field interaction between the different magnet packs, nitrogen implantation is not uniform between front and rear disk surfaces. In addition, the nitrogen implantation is not uniform from the first disk as compared to the second disk. As such, there is a need for a system and method for uniformly implanting a preselected material on substrates using magnetic fields.

SUMMARY

Aspects of the invention relate to systems and methods for uniformly implanting materials on substrates using directed magnetic fields. In one embodiment, the invention relates to a system for uniformly implanting a material on a substrate using directed magnetic fields, the system including a chamber configured to receive a preselected material and to enclose a first substrate, a first rotating assembly configured to facilitate an implantation of the preselected material onto a first surface of the first substrate and including a first rotating magnet sub-assembly configured to direct a first magnetic field onto the first surface, a second rotating assembly configured to facilitate an implantation of the preselected material onto a second surface of the first substrate and including a second rotating magnet sub-assembly configured to direct a second magnetic field onto the second surface, and an radio frequency (RF) energizer configured to apply RF energy to the first substrate, where the first magnetic field and the second magnetic field combine to form a resultant magnetic field that is substantially parallel along the first surface and the second surface, and where the implantation of the preselected material onto the first substrate occurs based on a combination of the RF energy and the resultant magnetic field.

In another embodiment, the invention relates to a method for uniformly implanting a material on a substrate using directed magnetic fields, the method including rotating a first rotating magnet sub-assembly and thereby directing a first magnetic field onto a first surface of a first substrate, rotating a second rotating magnet sub-assembly and thereby directing a second magnetic field onto a second surface of the first substrate, saturating a chamber enclosing the first substrate with a preselected material, applying an radio frequency (RF) energy to the first substrate, where the first magnetic field and the second magnetic field combine to form a resultant magnetic field that is substantially parallel along the first surface and the second surface, and where an implantation of the preselected material onto the first substrate occurs based on a combination of the RF energy and the resultant magnetic field.

DETAILED DESCRIPTION

Figure 1:
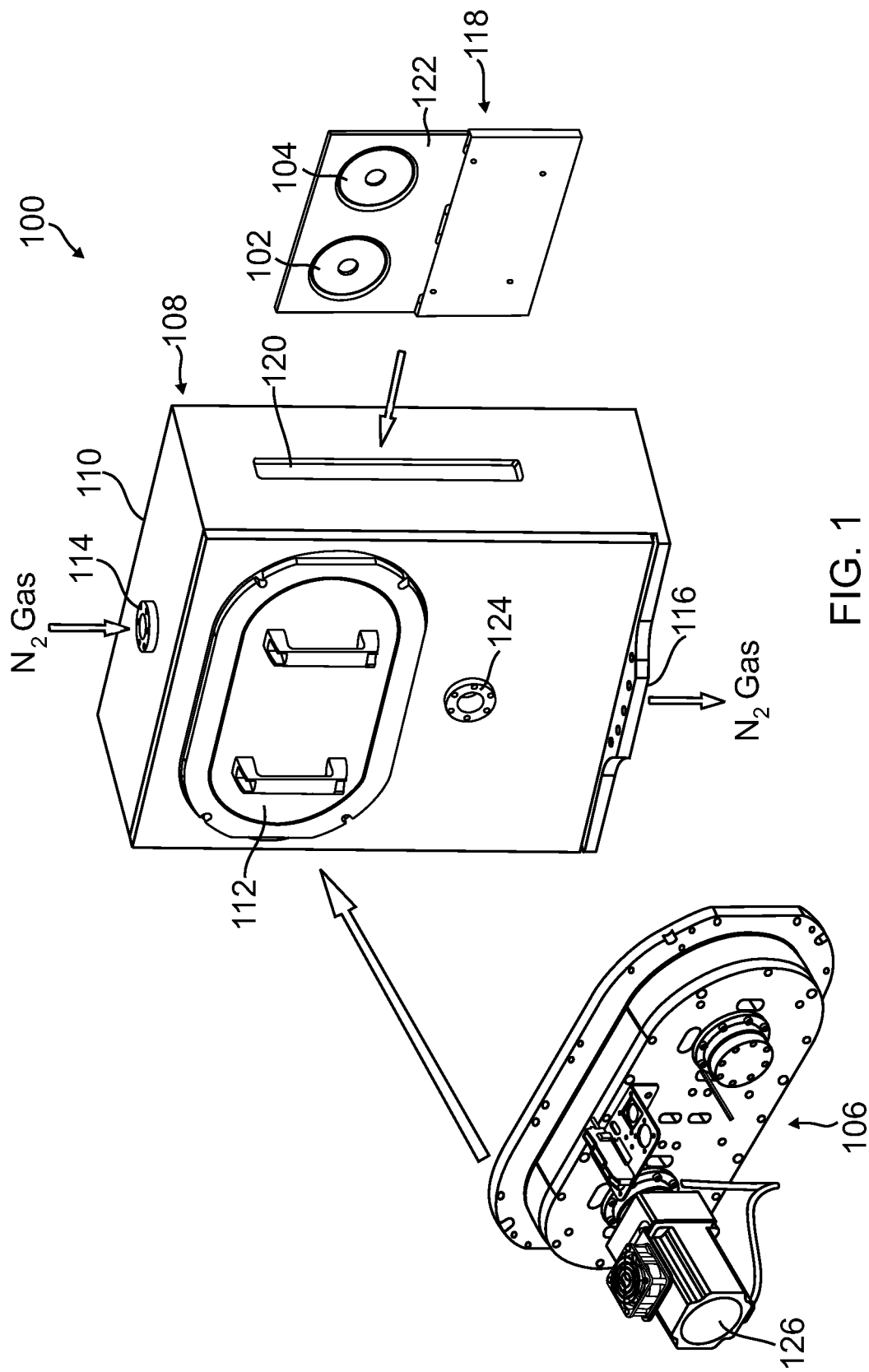
FIG. 1 is an exploded perspective view of a system for uniformly implanting materials on two substrates using front and rear rotating assemblies with rotating linear magnet sub-assemblies, where the front and rear rotating assemblies are mounted to an implantation chamber in accordance with one embodiment of the invention.

Referring now to the drawings, embodiments of systems and methods for uniformly implanting one or more preselected materials on substrates using directed magnetic fields are illustrated. The uniform implantation systems include a chamber for dispensing a preselected material and/or saturating an environment with the preselected material. First and second rotating assemblies, each including a rotating magnet sub-assembly, are mounted to opposing walls of the chamber to face a disk substrate mounted to a carrier positioned within the chamber. The chamber can be substantially saturated with the preselected material and the rotating magnet sub-assemblies can be made to rotate. The magnetic fields generated by the rotating magnet sub-assemblies constructively combine to form a resultant magnetic field that is substantially parallel along a first surface and a second surface of the disk substrate. Radio frequency (RF) energy can be applied to the carrier, thereby inducing implantation of the preselected material on the disk substrate in accordance with the resultant magnetic field.

In several embodiments, the rotating magnet sub-assemblies include multiple linear magnets arranged in a preselected configuration (e.g., linear magnet packs). In a number of embodiments, the disk substrate is mounted within an opening of a carrier with a planar body and the resultant magnetic field is effectively about zero along the planar body of the carrier, thereby avoiding damage to the carrier and contamination to the disk substrate from particles released from the carrier body. In several embodiments, the first and second rotating assemblies each include two rotating magnet sub-assemblies configured to target two disk substrates mounted on a carrier positioned between the first and second rotating assemblies. In some embodiments, the sub-assemblies are driven by a single drive motor and a timing belt. In one embodiment, the sub-assemblies are driven by dual drive motors that can be synchronized.

FIG. 1 is an exploded perspective view of a system 100 for uniformly implanting nitrogen on two substrates (102, 104) using front and rear rotating assemblies (106, 108) with rotating linear magnet sub-assemblies, where the front and rear rotating assemblies (106, 108) are mounted to an implantation chamber 110 in accordance with one embodiment of the invention. The chamber 110 includes a front removable panel 112 and a rear removable panel (not visible) that are removed and replaced by the front and rear rotating assemblies (106, 108), respectively. The rotating assemblies (106, 108) are then mounted to walls of the chamber 110. The chamber 110 includes a gas inlet 114 where the nitrogen gas is pumped in and a gas outlet 116 where the nitrogen gas is removed.

Figure 3:
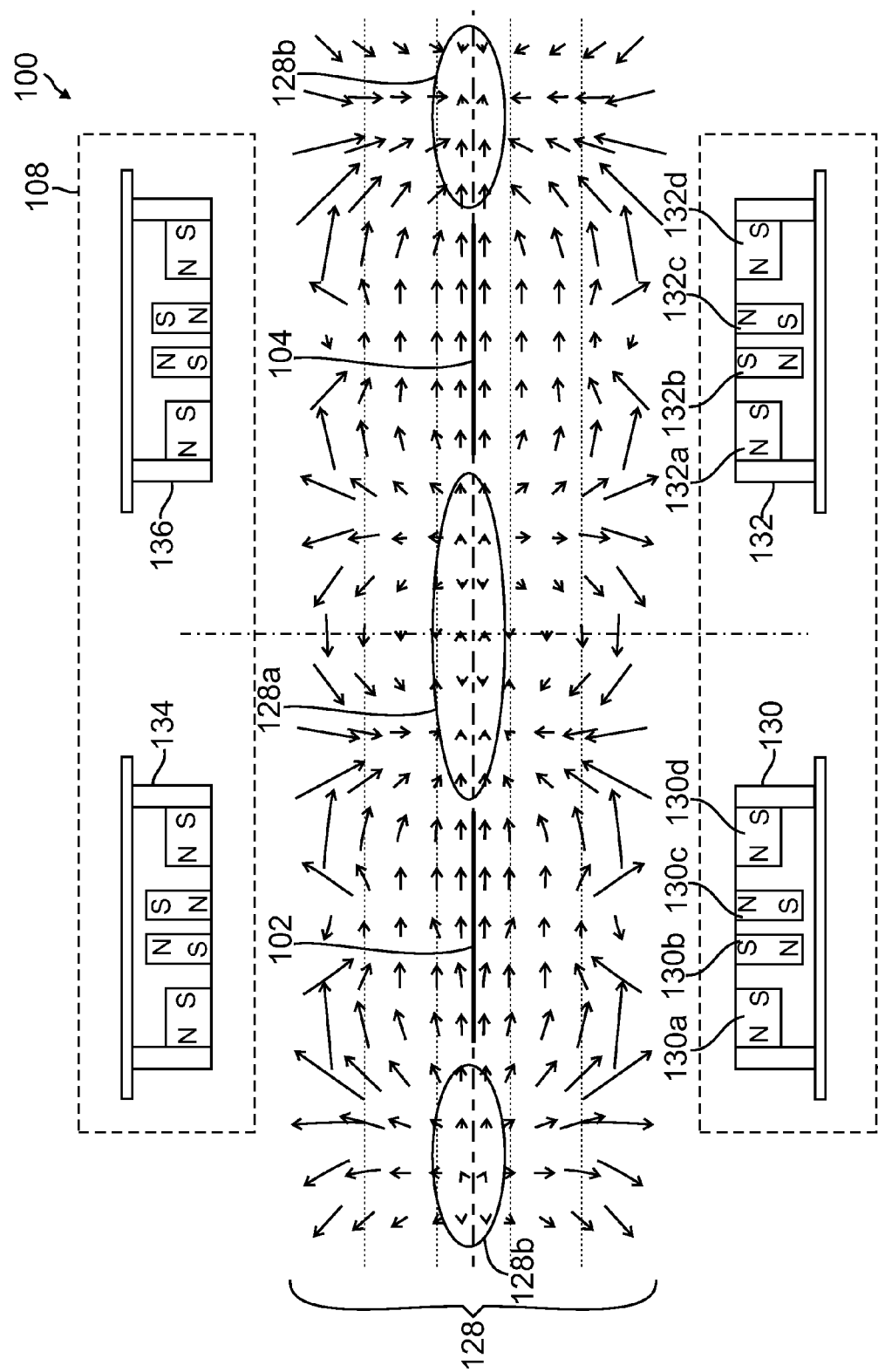
FIG. 3 is a schematic cross sectional view of the system of FIG. 1 including illustrations of the magnetic fields resulting from the rotating linear magnet sub-assemblies of the front and rear rotating assemblies in accordance with one embodiment of the invention.

The two disk substrates (102, 104) are mounted to a carrier panel assembly 118 that is configured to be inserted through an opening 120 in the chamber 110 such that the disk substrates (102, 104) are positioned between the two rotating assemblies (106, 108) and the respective rotating linear magnet sub-assemblies (not visible in FIG. 1 but see FIG. 3). The carrier panel assembly 118 includes planar body sections 122 having circular openings for receiving and retaining the disk substrates (102, 104). The chamber 110 also includes an RF energizer 124 configured to apply RF energy to the disk substrates (102, 104) when they are positioned within the chamber 110. In several embodiments, a controller (not shown) is coupled to the rotating assemblies, the RF energizer, and gas valves (not shown) and is configured to control and facilitate operation of the system 100.

In the embodiment illustrated in FIG. 1, the implantation system 100 is configured to implant nitrogen on to the disk substrates. In other embodiments, the implantation system 100 can be used to implant other preselected materials. In the embodiment illustrated in FIG. 1, the front and rear rotating assemblies (106, 108) include a single drive motor 126 to drive the rotating linear magnet sub-assemblies. In other embodiments, one or both of the rotating assemblies (106, 108) can include two drive motors for driving the rotating linear magnet sub-assemblies. In several embodiments, the chamber 110 is one of several chambers of a sputtering tool. In one such embodiment, the chamber 110 is one of several chambers of a sputtering tool made by Canon Anelva Corporation of Kurigi, Japan.

In the embodiment illustrated in FIG. 1, the carrier panel assembly 118 is configured to receive and retain the two disk substrates (102, 104). In other embodiments, the carrier panel assembly 118 can be configured to receive and retain a single disk substrate, or more than two disk substrates. In several embodiments, the disk substrates are made of carbon or other suitable materials. In a number of embodiments, the disk substrates have a preselected disk shape and are configured for magnetically recording information within a magnetic storage device.

Figure 2:
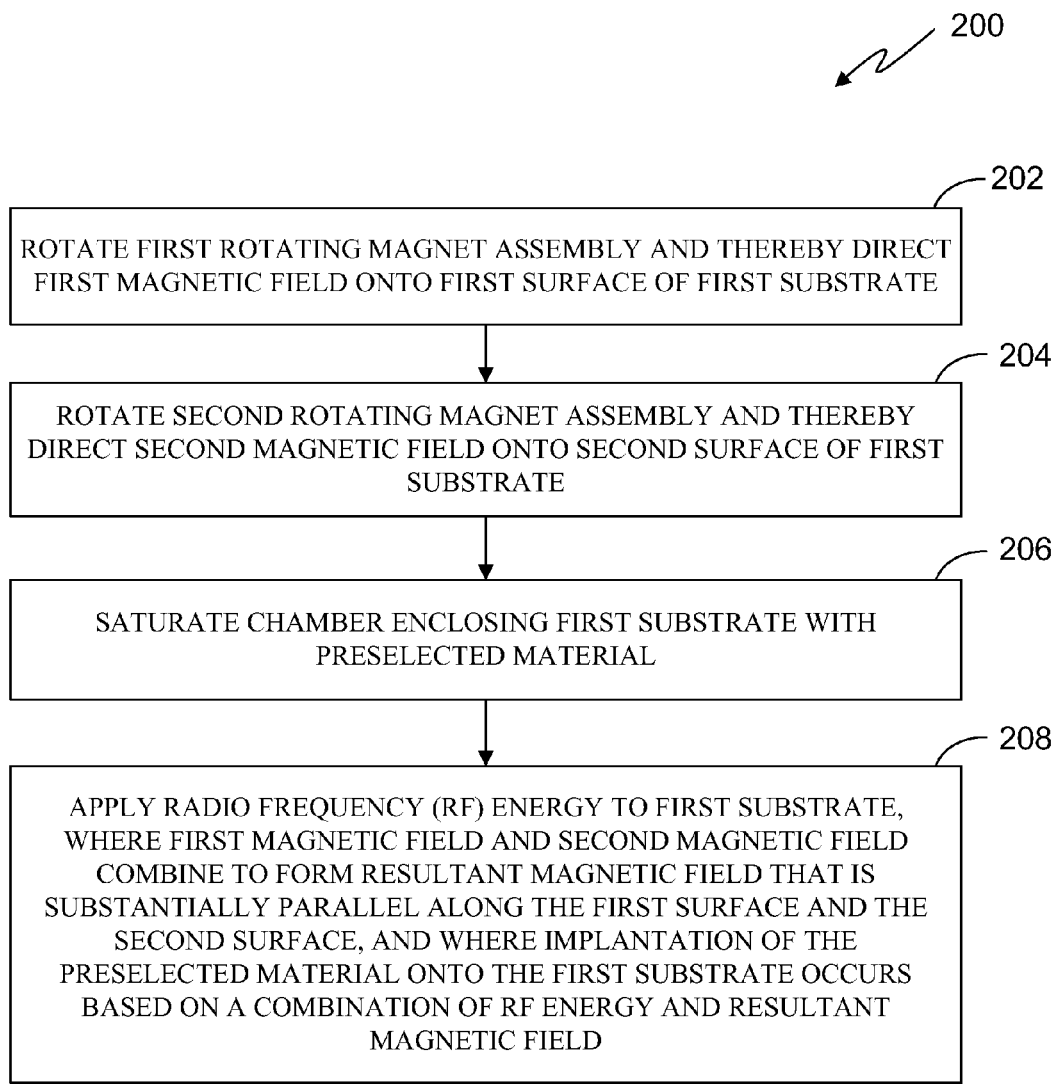
FIG. 2 is a flow chart of a process for operating a system for uniformly implanting materials on a substrate in accordance with one embodiment of the invention.

FIG. 2 is a flow chart of a process 200 for operating a system for uniformly implanting materials on a substrate in accordance with one embodiment of the invention. In several embodiments, the process 200 can be used in conjunction with the implantation system 100 of FIG. 1. The process first rotates (202) a first rotating magnet sub-assembly and thereby directs a first magnetic field onto a first surface of a first substrate. In many embodiments, the first rotating magnet sub-assembly is a component of a rotating assembly. The process then rotates (204) second rotating magnet sub-assembly and thereby directs a second magnetic field onto a second surface of the first substrate. In many embodiments, the second rotating magnet sub-assembly is a component of a second rotating assembly.

The process saturates (206) a chamber enclosing the first substrate with a preselected material. In a number of embodiments, a chamber opening (e.g., gate valve) is first opened and a carrier panel including one or more disk substrates is moved into a middle area of the chamber. The gate valves can be closed and a preselected material in gas form (e.g., nitrogen) can be pumped into and out of the chamber at the same time to achieve a preselected saturation of the preselected material and a preselected stabilized pressure within the chamber. In one embodiment, it can take about 0.7 seconds to stabilize to the preselected pressure. In other embodiments, other suitable durations can be used to stabilize to the preselected pressure.

The process then applies (208) a radio frequency (RF) energy to the first substrate. In such case, the first magnetic field and the second magnetic field combine to form a resultant magnetic field that is substantially parallel along the first surface and the second surface, and an implantation of the preselected material onto the first substrate occurs based on a combination of the RF energy and the resultant magnetic field. In several embodiments, the RF energy is applied to a carrier panel holding the first substrate, which can turn on the plasma of the preselected material under the influence of the resultant magnetic field. The implantation of the preselected material can occur fairly quickly after the RF energy has been applied. In one such embodiment, implantation of the preselected material occurs after the RF energy has been applied for about 2.5 seconds. In other embodiments, implantation of the preselected material occurs after other suitable durations. Once the desired degree of implantation has been achieved, the RF energy can be turned off, the intake of the preselected material in gas form can be stopped, residual gas can be pumped out of the chamber, and an exit gate valve can be opened to allow the carrier panel to exit the chamber.

Successful nitrogen implantation and related characteristics such as the nitrogen implantation rate can depend on factors including pressure, duration of implantation, RF power levels applied, RF tuning, magnetic field strength and other such factors known in the art. In several embodiments, the factors can be adjusted and optimized for achieving desired implantation characteristics.

In one embodiment, the process can perform the sequence of actions in a different order. In another embodiment, the process can skip one or more of the actions. In other embodiments, one or more of the actions are performed simultaneously. In some embodiments, additional actions can be performed.

FIG. 3 is a schematic cross sectional view of the system 100 of FIG. 1 including illustrations of the magnetic fields 128 resulting from the rotating linear magnet sub-assemblies (130, 132, 134, 136) of the front and rear rotating assemblies (106, 108) in accordance with one embodiment of the invention. As can be seen in FIG. 3, the resultant magnetic fields 128 surround the first disk substrate 102 and the second disk substrate 104. In particular, in regions just above and below the first disk substrate 102 and the second disk substrate 104, the magnitude and direction of the resultant magnetic field 128 is substantially constant and extends in a direction substantially parallel to a surface of either disk substrate (102, 104). This effect of the uniform magnitude and parallel direction magnetic field is highly desirable as it facilitates uniform implantation of the preselected material (e.g., nitrogen). In prior art systems, which may include ring magnets in a fixed configuration, the magnetic fields above and below the disk substrates (102, 104) can be non-uniform in both direction and magnitude, and therefore result in poor implantation. In addition, the resultant magnetic fields of such prior art systems can be relatively weak due to the non-constructive magnetic interaction of the fixed ring magnets.

In the region 128a between the first disk substrate 102 and the second disk substrate 104, and the outside lateral regions 128b just laterally beyond the disk substrates (102, 104), the resultant magnetic field 128 quickly drops to about zero magnitude. This second effect is highly desirable as it helps reduce any undesirable material implantation, and therefore degradation, of the carrier panel body 122 (not shown in FIG. 3 but see FIG. 1). In the prior art systems, which may include the ring magnets in the fixed configuration, the magnitude of the resultant magnetic field can be non-zero and even relatively substantial in magnitude in the region 128a between the disk substrates (102, 104). As a result, the carrier panel 122 can be degraded due to the implantation ion bombardment, and contamination of the disk substrates (102, 104) during implantation can occur (e.g., when the carrier body materials are ejected and transferred to the disk substrates).

Figure 4:
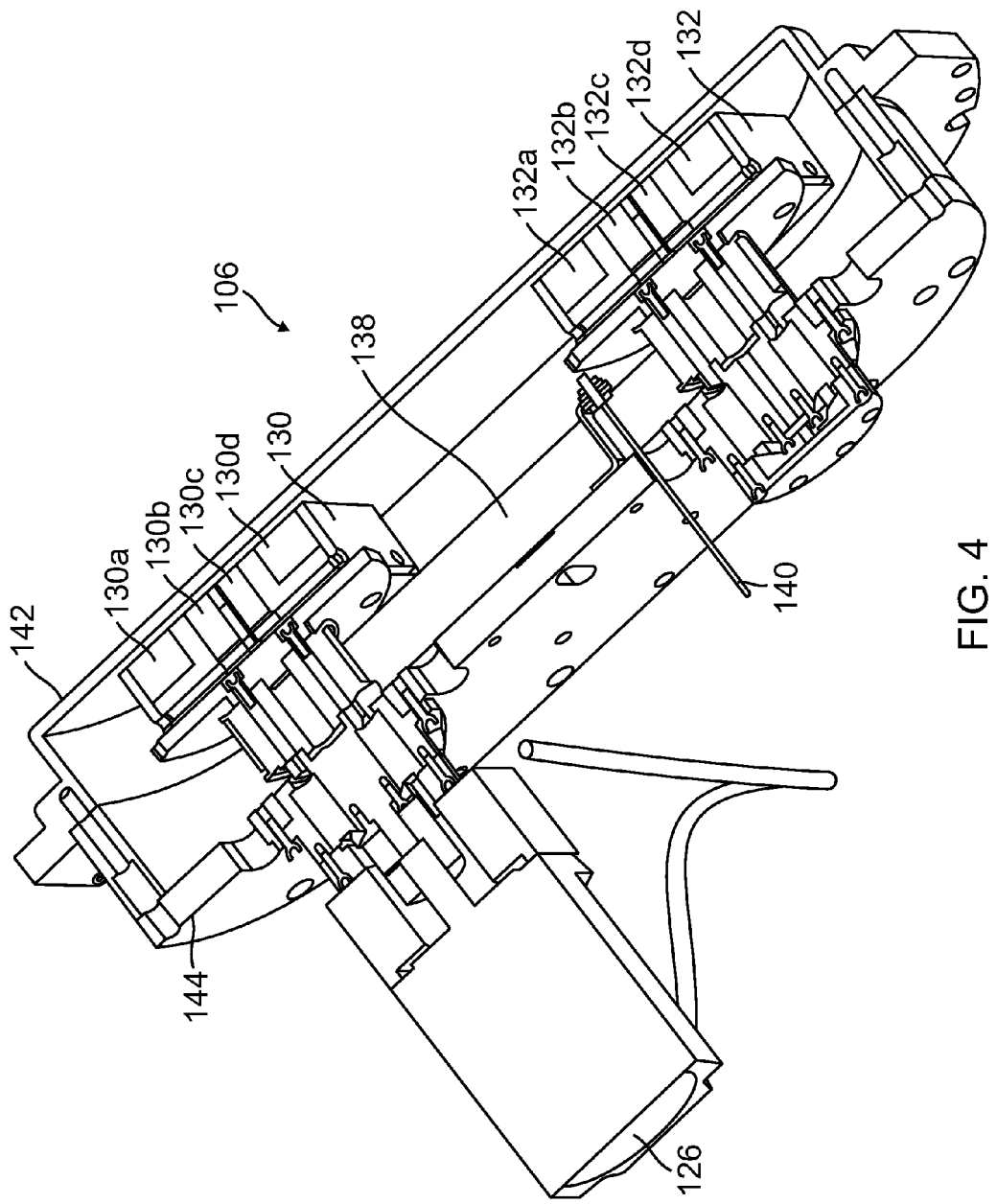
FIG. 4 is a rear cross sectional perspective view of the front rotating assembly of the material implantation system of FIG. 1 in accordance with one embodiment of the invention.

FIG. 4 is a rear cross sectional perspective view of the front rotating assembly 106 of the material implantation system of FIG. 1 in accordance with one embodiment of the invention. The front rotating assembly 106 includes a drive motor 126 for providing a rotational force on the first and second rotating linear magnet sub-assemblies (130, 132). The rotational force is applied directly and axially to the first rotating linear magnet sub-assembly 130 while a timing belt 138 transfers the rotational force of the drive motor 126 to the second rotating linear magnet sub-assembly 132 while substantially maintaining a preselected magnetic orientation of the two rotating linear magnet sub-assemblies. A homing sensor 140 is used in conjunction with the drive motor 126 and a control system (not illustrated) for ensuring that the first and second rotating linear magnet sub-assemblies (130, 132) are rotated in substantial synchronization and with the preselected magnetic orientation. The front rotating assembly 106 further includes a front mounting 142 for attachment to a chamber wall and a rear mounting plate 144, both of which serve to enclose and protect the rotating linear magnet sub-assemblies (130, 132) and timing belt 138.

The first rotating linear magnet sub-assembly 130 includes four linear magnets (130a, 130b, 130c, 130d) (e.g., in a linear magnet pack), each having a rectangular bar shape. Two of the four linear magnets (130a, 130d) are positioned along exterior regions of the first rotating linear magnet sub-assembly 130, and the other two linear magnets (130b, 130c) are positioned along interior regions of the first rotating linear magnet sub-assembly 130. The exterior linear magnets (130a, 130d) are positioned such that their poles are at opposite ends of an axis that is parallel to the front mounting 142 and a surface of the disk substrates (102, 104) when they are positioned inside an implantation chamber (see FIG. 3 for pole configurations). Effectively, the exterior linear magnets (130a, 130d) are positioned to be parallel with a surface of the disk substrates (102, 104). The interior linear magnets (130b, 130c) are positioned such that their poles are at opposite ends of an axis that is transverse (e.g., perpendicular) to the front mounting 142 and a surface of the disk substrates (102, 104) when they are positioned inside an implantation chamber. Effectively, the interior linear magnets (130b, 130c) are positioned to be transverse with a surface of the disk substrates (102, 104). The pole configuration of the first rotating linear magnet sub-assembly 130 is illustrated in FIG. 3.

Similar to the first rotating linear magnet sub-assembly 132, the second rotating linear magnet sub-assembly 132 also includes four linear magnets (132a, 132b, 132c, 132d) (e.g., in a linear magnet pack), each having a rectangular bar shape. Two of the four linear magnets (132a, 132d) are positioned along exterior regions of the first rotating linear magnet sub-assembly 132, and the other two linear magnets (132b, 132c) are positioned along interior regions of the first rotating linear magnet sub-assembly 132. The exterior linear magnets (132a, 132d) are positioned such that their poles are at opposite ends of an axis that is parallel to the front mounting 142 and a surface of the disk substrates (102, 104) when they are positioned inside an implantation chamber. Effectively, the exterior linear magnets (132a, 132d) are positioned to be parallel with a surface of the disk substrates (102, 104). The interior linear magnets (132b, 132c) are positioned such that their poles are at opposite ends of an axis that is transverse (e.g., perpendicular) to the front mounting 142 and a surface of the disk substrates (102, 104) when they are positioned inside an implantation chamber. Effectively, the interior linear magnets (132b, 132c) are positioned to be transverse with a surface of the disk substrates (102, 104). The pole configuration of the second rotating linear magnet sub-assembly 132 is illustrated in FIG. 3.

In several embodiments, the linear magnets (130a, 130b, 130c, 130d, 132a, 132b, 132c, 132d) are composed of several smaller magnets. The smaller magnets can be bar magnets with a rectangular or square shape. In some embodiments, the smaller magnets can have non-symmetric shapes as well. In one embodiment, each linear magnet is composed of two or three smaller bar magnets. In some embodiments, the rotating magnetic sub-assemblies (130, 132) can include or consist of non-linear magnets that provide similar desirable magnetic field characteristics as are illustrated in FIG. 3.

Figure 5:
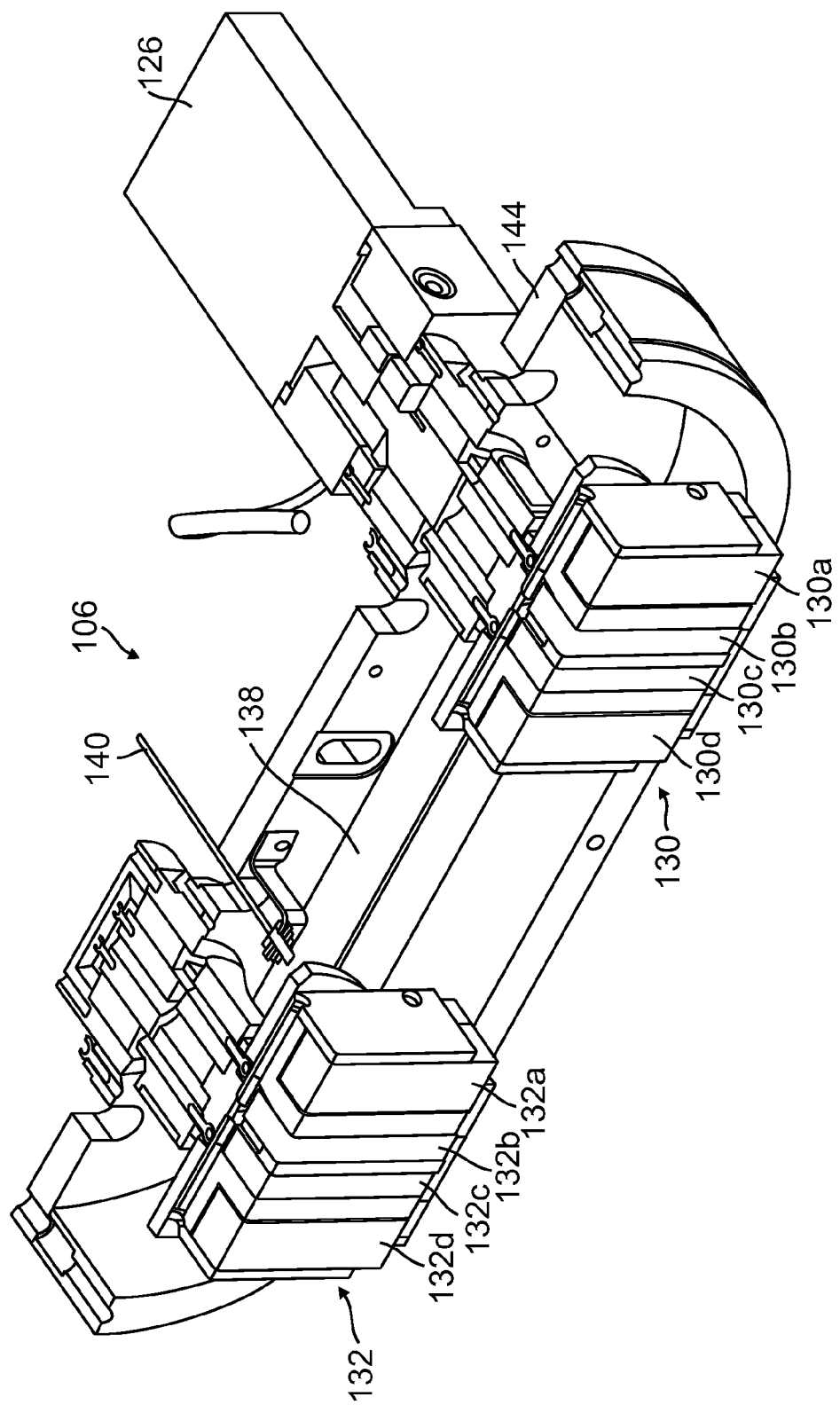
FIG. 5 is a front cross sectional perspective view of the front rotating assembly of FIG. 4 in accordance with one embodiment of the invention.

FIG. 5 is a front cross sectional perspective view of the rotating assembly 106 of FIG. 4 in accordance with one embodiment of the invention.

Figure 6:
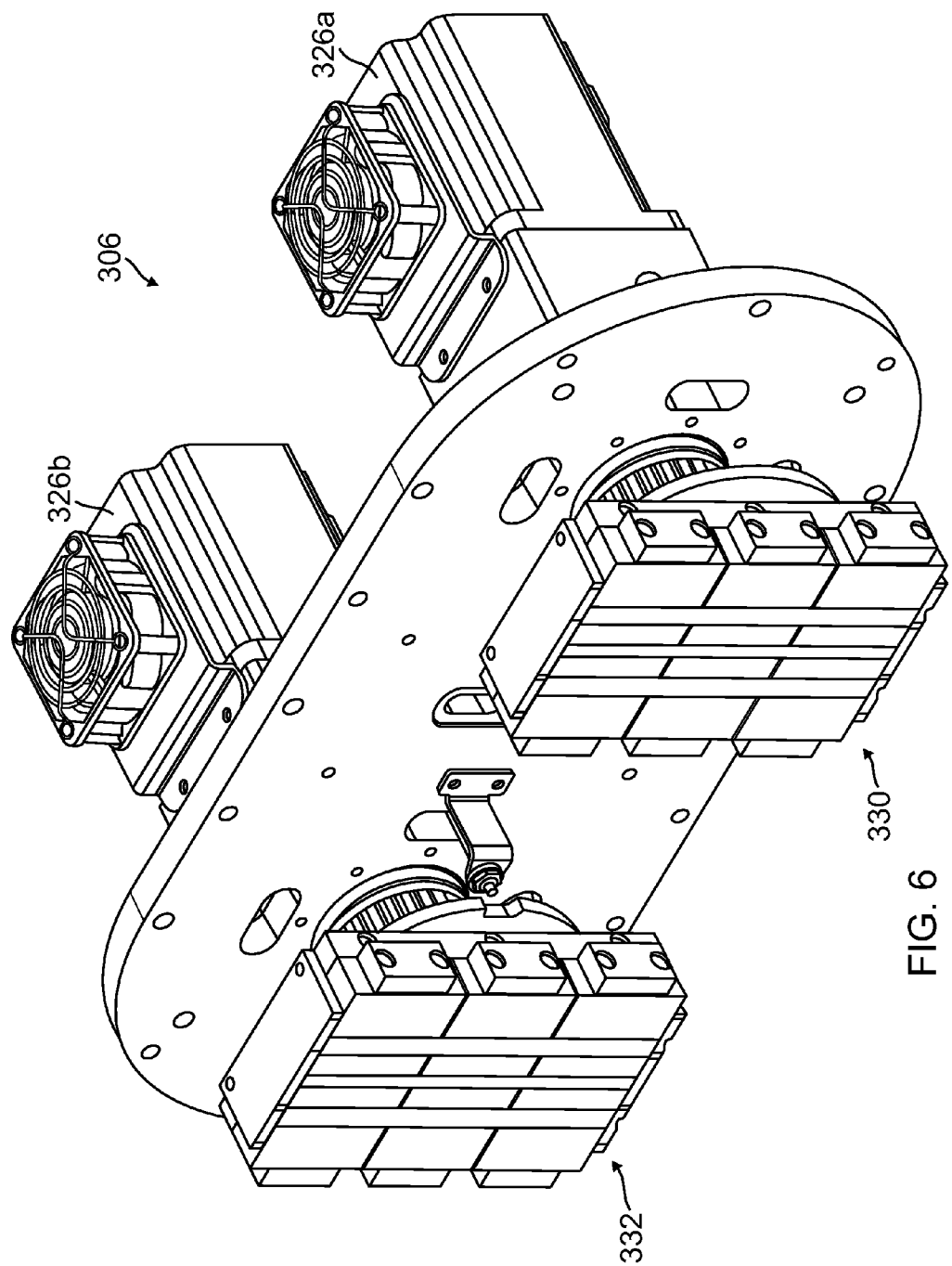
FIG. 6 is a front perspective view of an alternative rotating assembly including two drive motors in accordance with one embodiment of the invention.

FIG. 6 is a front perspective view of an alternative rotating assembly 306 including two drive motors (326a, 326b) in accordance with one embodiment of the invention. The alternative rotating assembly 306 also includes first and second rotating linear magnet sub-assemblies (330, 332). While rotating assembly 306 does not generally include a timing belt, it can otherwise operate in a similar fashion to the embodiments of rotating assemblies having single drive motors described above.

Figure 7:
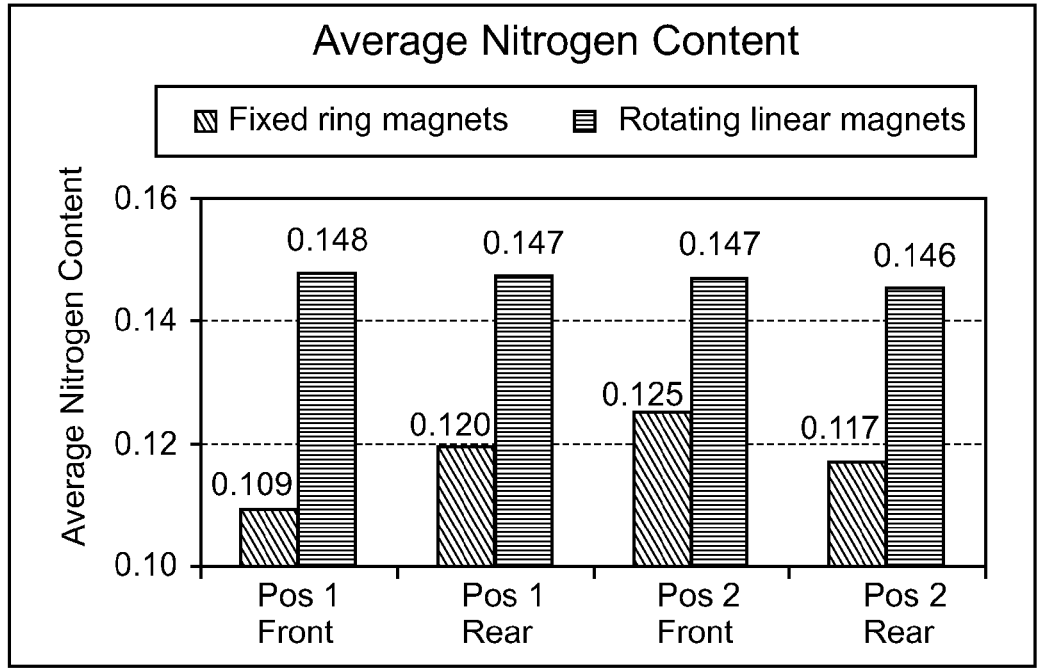
FIG. 7 is a bar chart illustrating a comparison of average nitrogen content for an implantation system in accordance with an embodiment of the invention and for a conventional implantation system using a fixed ring magnet type assembly.

FIG. 7 is a bar chart illustrating a comparison of average nitrogen content for an implantation system in accordance with an embodiment of the invention and for a conventional implantation system using a fixed ring magnet type assembly. The average nitrogen content is illustrated on the vertical axis while the each side (e.g., front and rear) of the two disk substrates (e.g., position 1 for disk 102 and position 2 for disk 104 as illustrated in FIGS. 1 and 3) is enumerated on the horizontal axis. As can be seen in FIG. 7, the implantation system with rotating linear magnets provides substantially greater average nitrogen content than the conventional implantation system including fixed ring magnets.

Figure 8:
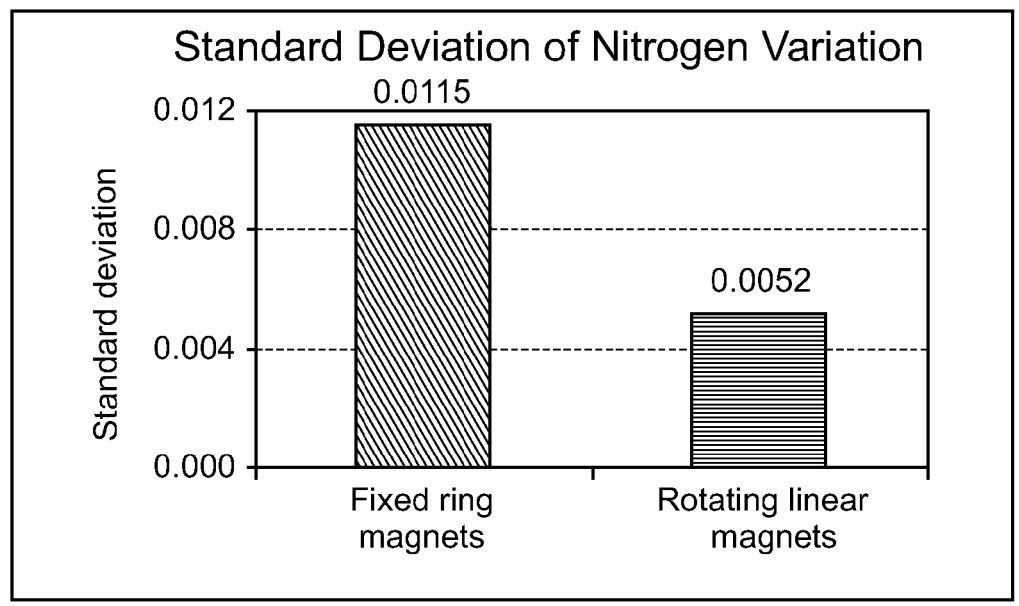
FIG. 8 is a bar chart illustrating a comparison of a standard deviation (non-uniformity) of nitrogen for an implantation system in accordance with an embodiment of the invention and for a conventional implantation system using a fixed ring magnet type assembly.

FIG. 8 is a bar chart illustrating a comparison of a standard deviation (non-uniformity) of nitrogen for an implantation system in accordance with an embodiment of the invention and for a conventional implantation system using a fixed ring magnet type assembly. The standard deviation is illustrated on the vertical axis, while the type of implantation system is enumerated on the horizontal axis. As can be seen in FIG. 8, the implantation system with rotating linear magnets provides substantially less non-uniformity of the implantation material (e.g., nitrogen) than the conventional implantation system including fixed ring magnets. Stated another way, the implantation system with rotating linear magnets provides substantially greater uniformity of the implantation material than the conventional implantation system including fixed ring magnets.

While the above description contains many embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A system for uniformly implanting a material on a substrate using directed magnetic fields, the system comprising:
    a chamber configured to receive a preselected material and to enclose a first substrate;
    a first rotating assembly configured to facilitate an implantation of the preselected material onto a first surface of the first substrate and comprising a first rotating magnet sub-assembly configured to direct a first magnetic field onto the first surface;
    a second rotating assembly configured to facilitate an implantation of the preselected material onto a second surface of the first substrate and comprising a second rotating magnet sub-assembly configured to direct a second magnetic field onto the second surface; and
    an radio frequency (RF) energizer configured to apply RF energy to the first substrate;
    wherein the first magnetic field and the second magnetic field combine to form a resultant magnetic field that is substantially parallel along the first surface and the second surface; and
    wherein the implantation of the preselected material onto the first substrate occurs based on a combination of the RF energy and the resultant magnetic field.

2. The system of claim 1:
    wherein the first substrate comprises a disk shaped substrate; and
    wherein the resultant magnetic field is about zero in areas beyond an outer edge of the disk shaped substrate.

3. The system of claim 1:
    wherein the first substrate comprises a disk shaped substrate;
    the system further comprising a carrier configured to retain the disk shaped substrate in a fixed position during the implantation of the preselected material and having a planar body with an opening configured to receive the disk shaped substrate;
    wherein the resultant magnetic field is about zero along the planar body of the carrier.

4. The system of claim 1:
    wherein the first rotating magnet sub-assembly comprises a linear magnet; and
    wherein the second rotating magnet sub-assembly comprises a linear magnet.

5. The system of claim 1:
    wherein the first rotating magnet sub-assembly comprises four linear magnets; and
    wherein the second rotating magnet sub-assembly comprises four linear magnets.

6. The system of claim 5:
    wherein two of the four linear magnets of the first rotating magnet sub-assembly are positioned parallel to the first surface of the first substrate;
    wherein two of the four linear magnets of the first rotating magnet sub-assembly are positioned transverse to the first surface of the first substrate;
    wherein two of the four linear magnets of the second rotating magnet sub-assembly are positioned parallel to the second surface of the first substrate; and
    wherein two of the four linear magnets of the second rotating magnet sub-assembly are positioned transverse to the second surface of the first substrate.

7. The system of claim 6:
    wherein the two transverse linear magnets of the first rotating magnet sub-assembly are positioned between the two parallel linear magnets of the first rotating magnet sub-assembly; and
    wherein the two transverse linear magnets of the second rotating magnet sub-assembly are positioned between the two parallel linear magnets of the second rotating magnet sub-assembly.

8. The system of claim 5:
    wherein each of the four linear magnets of the first rotating magnet sub-assembly comprise a rectangular bar shape; and
    wherein each of the four linear magnets of the second rotating magnet sub-assembly comprises a rectangular bar shape.

9. The system of claim 1, wherein the preselected material comprises nitrogen.

10. The system of claim 1, wherein the first substrate comprises carbon.

11. The system of claim 1, wherein the first substrate comprises a disk shape and is configured to be used for magnetic recording within a magnetic storage device.

12. The system of claim 1:
    wherein the first rotating assembly is configured to facilitate implantation of the preselected material onto a first surface of a second substrate and comprises a third rotating magnet sub-assembly configured to direct a third magnetic field onto the first surface of the second substrate; and
    wherein the second rotating assembly is configured to facilitate implantation of the preselected material onto a second surface of the second substrate and comprises a fourth rotating magnet sub-assembly configured to direct a fourth magnetic field onto the second surface of the second substrate.

13. The system of claim 12:
    wherein the first rotating assembly comprises a first driving motor for rotating the first rotating magnet sub-assembly and the third rotating magnet sub-assembly; and
    wherein the second rotating assembly comprises a second driving motor for rotating the second rotating magnet sub-assembly and the fourth rotating magnet sub-assembly.

14. The system of claim 13:
    wherein the first rotating assembly is configured to rotate the first rotating magnet sub-assembly and the third rotating magnet sub-assembly about synchronously; and
    wherein the second rotating assembly is configured to rotate the second rotating magnet sub-assembly and the fourth rotating magnet sub-assembly about synchronously.

15. The system of claim 13:
wherein the first rotating assembly is configured to rotate the first rotating magnet sub-assembly and the third rotating magnet sub-assembly about synchronously using a first timing belt and a first homing sensor; and
wherein the second rotating assembly is configured to rotate the second rotating magnet sub-assembly and the fourth rotating magnet sub-assembly about synchronously using a second timing belt and a second homing sensor.

16. The system of claim 12:
wherein the first rotating magnet sub-assembly and the third rotating magnet sub-assembly are positioned side by side;
wherein the second rotating magnet sub-assembly and the fourth rotating magnet sub-assembly are positioned side by side;
wherein the first rotating magnet sub-assembly is positioned opposite of the second rotating magnet sub-assembly; and
wherein the third rotating magnet sub-assembly is positioned opposite of the fourth rotating magnet sub-assembly.

17. The system of claim 12:
wherein the chamber comprises a first wall opposing a second wall;
wherein the first substrate and the second substrate are positioned between the first wall and the second wall;
wherein the first rotating assembly is mounted to the first wall; and
wherein the second rotating assembly is mounted to the second wall.

18. The system of claim 1:
wherein the chamber comprises a first wall opposing a second wall;
wherein the first substrate is positioned between the first wall and the second wall;
wherein the first rotating assembly is mounted to the first wall; and
wherein the second rotating assembly is mounted to the second wall.

19. A method for uniformly implanting a material on a substrate using directed magnetic fields, the method comprising:
rotating a first rotating magnet sub-assembly and thereby directing a first magnetic field onto a first surface of a first substrate;
rotating a second rotating magnet sub-assembly and thereby directing a second magnetic field onto a second surface of the first substrate;
saturating a chamber enclosing the first substrate with a preselected material;
applying an radio frequency (RF) energy to the first substrate;
wherein the first magnetic field and the second magnetic field combine to form a resultant magnetic field that is substantially parallel along the first surface and the second surface; and
wherein an implantation of the preselected material onto the first substrate occurs based on a combination of the RF energy and the resultant magnetic field.

20. The method of claim 19:
wherein the first substrate comprises a disk shaped substrate; and
wherein the resultant magnetic field is about zero in areas beyond an outer edge of the disk shaped substrate.

21. The method of claim 19:
wherein the first substrate comprises a disk shaped substrate;
the method further comprising retaining the disk shaped substrate in a fixed position during the implantation of the preselected material using a carrier having a planar body with an opening configured to receive the disk shaped substrate;
wherein the resultant magnetic field is about zero along the planar body of the carrier.

22. The method of claim 19:
wherein the first rotating magnet sub-assembly comprises a linear magnet; and
wherein the second rotating magnet sub-assembly comprises a linear magnet.

23. The method of claim 19:
wherein the first rotating magnet sub-assembly comprises four linear magnets; and
wherein the second rotating magnet sub-assembly comprises four linear magnets.

24. The method of claim 23:
wherein two of the four linear magnets of the first rotating magnet sub-assembly are positioned parallel to the first surface of the first substrate;
wherein two of the four linear magnets of the first rotating magnet sub-assembly are positioned transverse to the first surface of the first substrate;
wherein two of the four linear magnets of the second rotating magnet sub-assembly are positioned parallel to the second surface of the first substrate; and
wherein two of the four linear magnets of the second rotating magnet sub-assembly are positioned transverse to the second surface of the first substrate.

25. The method of claim 24:
wherein the two transverse linear magnets of the first rotating magnet sub-assembly are positioned between the two parallel linear magnets of the first rotating magnet sub-assembly; and
wherein the two transverse linear magnets of the second rotating magnet sub-assembly are positioned between the two parallel linear magnets of the second rotating magnet sub-assembly.

26. The method of claim 23:
wherein each of the four linear magnets of the first rotating magnet sub-assembly comprise a rectangular bar shape; and
wherein each of the four linear magnets of the second rotating magnet sub-assembly comprises a rectangular bar shape.

27. The method of claim 19, wherein the preselected material comprises nitrogen.

28. The method of claim 19, wherein the first substrate comprises carbon.

29. The method of claim 19, wherein the first substrate comprises a disk shape and is configured to be used for magnetic recording within a magnetic storage device.

30. The method of claim 19, further comprising:
rotating a third rotating magnet sub-assembly and thereby directing a third magnetic field onto a first surface of a second substrate in the chamber;
rotating a fourth rotating magnet sub-assembly and thereby directing a fourth magnetic field onto a second surface of the second substrate; and
applying the radio frequency (RF) energy to the second substrate;
wherein the third magnetic field and the fourth magnetic field combine to form a second resultant magnetic field that is substantially parallel along the first and second surfaces of the second substrate; and wherein an implantation of the preselected material onto the second substrate occurs based on a combination of the RF energy and the second resultant magnetic field.

31. The method of claim 30:
wherein a first rotating assembly comprises the first rotating magnet sub-assembly, the third rotating magnet sub-assembly, and a first driving motor configured to rotate the first rotating magnet sub-assembly and the third rotating magnet sub-assembly; and wherein a second rotating assembly comprises the second rotating magnet sub-assembly, the fourth rotating magnet sub-assembly, and a second driving motor configured to rotate the second rotating magnet sub-assembly and the fourth rotating magnet sub-assembly.

32. The method of claim 31:
wherein the first rotating assembly is configured to rotate the first rotating magnet sub-assembly and the third rotating magnet sub-assembly about synchronously; and wherein the second rotating assembly is configured to rotate the second rotating magnet sub-assembly and the fourth rotating magnet sub-assembly about synchronously.

33. The method of claim 31:
wherein the first rotating assembly is configured to rotate the first rotating magnet sub-assembly and the third rotating magnet sub-assembly about synchronously using a first timing belt and a first homing sensor; and wherein the second rotating assembly is configured to rotate the second rotating magnet sub-assembly and the fourth rotating magnet sub-assembly about synchronously using a second timing belt and a second homing sensor.

34. The method of claim 30:
wherein the first rotating magnet sub-assembly and the third rotating magnet sub-assembly are positioned side by side;

wherein the second rotating magnet sub-assembly and the fourth rotating magnet sub-assembly are positioned side by side;

wherein the first rotating magnet sub-assembly is positioned opposite of the second rotating magnet sub-assembly; and wherein the third rotating magnet sub-assembly is positioned opposite of the fourth rotating magnet sub-assembly.

* * * * *